transfer image exhibited the following reflection densities (measured 6 hours after processing):

|        | Red  | Green | Blue |
|--------|------|-------|------|
| $D_{max.}$ | 1.96 | 2.00  | 1.85 |
| $D_{min.}$ | 0.15 | 0.17  | 0.21 |

The characteristic curves of the red, green and blue densities of the neutral column are reproduced in FIG. 1. The transfer image exhibited a markedly extended dynamic range (43 red, 37 green and 27 blue). The transfer image exhibited very good color saturation and color separation with lower contrast than would have been obtained using the same silver iodobromide emulsion in the green- and red-sensitive silver halide emulsion layers as was used in the blue-sensitive silver halide emulsion layer.

EXAMPLE 4

The procedure described in Example 3 was repeated except that the blue-sensitive silver halide emulsion layer also contained the substituted-halide silver iodochlorobromide emulsion (as used in the green- and red-sensitive silver halide emulsion layers), coated at a coverage of about 120 mgs./ft.$^2$ of silver and about 94 mgs./ft.$^2$ of gelatin. The neutral density column exhibited the following reflection densities:

|        | Red  | Green | Blue |
|--------|------|-------|------|
| $D_{max.}$ | 1.95 | 1.95  | 1.83 |
| $D_{min.}$ | 0.15 | 0.17  | 0.21 |

The characteristic curves of the red, green and blue components of the neutral density column are reproduced in FIG. 2. The multicolor transfer image obtained in this example also exhibited low contrast, good color saturation and good color isolation. The dynamic range, while extended, was not as large as exhibited by the transfer image of Example 3.

EXAMPLE 5

A multicolor photosensitive element similar to that prepared in Examples 3 and 4 was prepared using the same cyan, magenta and yellow dye developers and a substituted-halide silver iodochlorobromide emulsion (approximately 79 mole percent bromide, 3 mole percent iodide, and 18 mole percent chloride) prepared as described in Example 2.

This photosensitive element was prepared by coating a gelatin-subcoated 4 mil opaque polyethylene terephthalate film base with the following layers:

1. a layer of cyan dye developer dispersed in gelatin and coated at a coverage of about 58 mgs./ft.$^2$ of dye and about 29 mgs./ft.$^2$ of gelatin;

2. a red-sensitive gelatino silver iodochlorobromide emulsion coated at a coverage of about 90 mgs./ft.$^2$ of silver and about 40 mgs./ft.$^2$ of gelatin;

3. a layer of a 60-30-46 copolymer of butylacrylate, diacetone acrylamide, styrene and methacrylic acid and polyacrylamide coated at a coverage of about 194 mgs./ft.$^2$ of the copolymer and about 6 mgs./ft.$^2$ of polyacrylamide;

4. a layer of magenta dye developer dispersed in gelatin and coated at a coverage of about 83 mgs./ft.$^2$ of dye and about 51 mgs./ft.$^2$ of gelatin;

5. a green-sensitive gelatino silver iodochlorobromide emulsion coated at a coverage of about 80 mgs./ft.$^2$ of silver and about 35 mgs./ft.$^2$ of gelatin;

6. a layer containing the copolymer referred to above in layer 3 and polyacrylamide coated at a coverage of about 95 mgs./ft.$^2$ of copolymer and about 12 mgs./ft.$^2$ of polyacrylamide;

7. a layer of yellow dye developer dispersed in gelatin and coated at a coverage of about 103 mgs./ft.$^2$ of dye and about 42 mgs./ft.$^2$ of gelatin;

8. a blue-sensitive gelatino silver iodochlorobromide emulsion layer including the auxiliary developer 4'-methylphenyl hydroquinone coated at a coverage of about 144 mgs./ft.$^2$ of silver, about 63 mgs./ft.$^2$ of gelatin and about 36 mgs./ft.$^2$ of auxiliary developer; and 9. a layer of gelatin coated at a coverage of about 40 mgs./ft.$^2$ of gelatin.

The photosensitive element was exposed and processed in the same manner as described in Example 3, except the concentration in the processing composition of the 6-methyl uracil was 0.64 g. and the concentration of the potassium hydroxide was 4.85 g. The neutral column of resulting multicolor integral negative-positive reflection print exhibited the following densities:

|        | Red  | Green | Blue |
|--------|------|-------|------|
| $D_{max.}$ | 2.05 | 2.16  | 2.01 |
| $D_{min.}$ | 0.16 | 0.18  | 0.25 |

As evidenced by the characteristic curves reproduced in FIG. 3 of the red, green and blue density components of the neutral density column, the transfer image was of lower contrast and greater dynamic range (in excess of 70) than the images obtained in either Examples 3 or 4. The toe extant of the characteristic curves, however, was not as long.

As noted above in connection with Examples 3, 4 and 5, use of a predominantly homogeneous grain size substitutedhalide silver halide emulsion has been found to give lower contrast than was obtained with silver halide emulsions of the type represented in FIG. 5, together with comparable color separation and color saturation. Improved temperature latitude was observed, with less change in color balance at higher temperatures. A highly significant increase also was obtained in the dynamic range of the multicolor transfer image, and the resulting extended exposure latitude was readily demonstrated in flash exposures, in that subjects closer to and farther from the camera were well reproduced. The reason or reasons for these highly desirable sensitometric improvements are not understood, but it is clear that they are directly attributable to the use of the predominantly homogeneous substituted-halide silver halide emulsions. It has been demonstrated, for example, that the induction period for the appearance of fog silver is markedly longer, e.g., about three to four times as long, with the substitutedhalide silver halide emulsions than with the single jet emulsions of FIG. 5. This delay in the occurrence of fog development which would immobilize dye developer that otherwise would transfer is consistent with the observed lower contrast and longer dynamic range.

While the specific examples given above have been directed to the formation of multicolor integral negativepositive reflection prints, it will be understood that the invention is indeed applicable to multicolor

PHOTOSENSITIVE PRINTING PLATE

BACKGROUND OF THE INVENTION

1. Field of the Invention

The present invention relates generally to a photosensitive printing plate and more particularly it relates to a photosensitive printing plate for making a printing master capable of providing good reproductions by directly imaging an original of continuous tone under a halftone screen.

2. Description of the Prior Art

A lithographic master generally has oleophilic ink-receptive areas for forming image portions and hydrophilic portions for providing non-image portions. As the method of making such a master there is known a method in which only the image areas of a hydrophilic surface are converted into the oleophilic state and a method in which a hydrophilic layer is formed on the surface of an oleophilic material and the hydrophilic layer is removed only at the image portions to there expose the oleophilic surface. One of the methods belonging to the latter class is disclosed in, for instance, Japanese Pat. No. 594459 in which a printing master is produced by imaging a photosensitive plate prepared by applying a hydrophilic layer containing nucleating materials for diffusion transfer development over a support having an oleophilic surface and subjecting the plate to a diffusion transfer development to form a silver image on the hydrophilic layer and then removing the hydrophilic layer of the portions corresponding to the silver image by an etching bleach treatment to there expose the oleophilic surface of the support. Also, in the specification of U.S. Pat. No. 3,385,701 there is described a method of making a printing master by bringing an exposed negative into contact with a sheet support having on its oleophilic surface a hydrophilic layer containing nucleating materials for diffusion transfer process, then subjecting the assembly to a diffusion transfer development to form a silver image on the hydrophilic layer, and then removing the hydrophilic layer corresponding to the silver image by an etching bleach treatment to there expose the oleophilic surface of the support.

The masters produced by these conventional methods aim at the reproduction of originals of a line image and have the disadvantage of being inferior in the reproducibility of originals of continuous tone.

In general, in case of photomechanical printing it is necessary to convert an original having continuous tone into a halftone image. According to a typical method that has been practiced at present, a master is produced by printing an original of continuous tone under a halftone screen onto a lithographic photosensitive material having a super-high contrast, making a halftone negative or halftone positive composed of hard dots by applying a lithographic development, and then printing the negative or positive onto a proper printing material such as a pre-sensitized printing plate followed by development.

As will be anticipated from the principle of making dot images, the light pattern of the dots is such that the intensity of light is strongest at the central portion thereof, weakest at the periphery, and varies continuously from the center to the periphery. Thus, if a silver image of dots is formed in conformity with the light pattern, the density of the dots will, as a matter of course, become gradually lower from the center thereof to the periphery. Therefore, in order to increase the contrast of the peripheral portion of the dot as high as possible to provide a hard boundary, it is required to use a lithographic photosensitive material of a super-high contrast and a lithographic developing method.

However, a conventional printing master as mentioned above, is formed by applying a so-called diffusion transfer developing method to silver images. The developing solution used for the diffusion transfer process contains a solvent for silver halide together with a developing agent and a silver image is formed in an image-receiving layer by the reduction of the complex salt of silver halide diffused from the non-exposed areas of the photosensitive layer by the action of the solvent for silver halide with the developing agent at the nucleating materials such as colloidal silver contained in the image-receiving layer.

The printing master as mentioned above may also be produced by applying an etching bleach treatment utilizing a silver image. In such an etching bleach system, if the optical density of the dots is less than 0.3, the amount of silver is insufficient and the etching of the hydrophilic layer becomes unsatisfactory. Accordingly, an ink does not attach well to the insufficiently etched portions at inking. That is to say, the optical density of the dots, when less than 0.3, does not give an effective density. The dot having less peripheral portion having no such effective density is called a "hard dot". Because a soft dot has lower peripheral density, the etching of the hydrophilic layer at the peripheral portions of the dots is insufficiently conducted at the etching bleach stage and thus the size of the dot to be printed will be reduced. Also, since the dots composing the highlight portions are small, the dot portions of the hydrophilic layer are not substantially etched in the case of a soft dot, which results in failing to print the highlight portion.

As will be understood by the afore-mentioned explanation, a master prepared as separate dots from originals of continuous tone in accordance with a known method is inferior in reproducibility of continuous tone owing to the dots being soft dots. In fact, by using such a master it is impossible to obtain reproduction of copies having a continuous tone.

An object of this invention is, therefore, to provide a photosensitive printing material capable of providing a master which is excellent in reproducibility of continuous tone originals.

Another object of this invention is to provide a process of readily making a printing master by imaging an original of a continuous tone directly on the photosensitive printing material under a halftone screen and then applying to the printing plate a diffusion transfer developing process and etching bleach process.

Other objects of this invention will become apparent from the following description.

SUMMARY OF THE INVENTION

These objects of this invention are attained by incorporating an alginate in a hydrophilic diffusion transfer image-receiving layer containing nucleating materials for physical development of a photosensitive printing plate having the image-receiving layer and a photosensitive silver halide emulsion layer on an oleophilic support or by inserting an image-receiving subsidiary layer between the image-receiving layer and the photosensitive emulsion layer.

BRIEF DESCRIPTION OF THE DRAWINGS

FIGS. 3A, 3B and 3C are diagrammatical sectional views showing a printing master in the main stages of the step of producing the master by using the photosensitive printing plate of this invention.

DESCRIPTION OF THE PREFERRED EMBODIMENTS

Figures 1, 2:
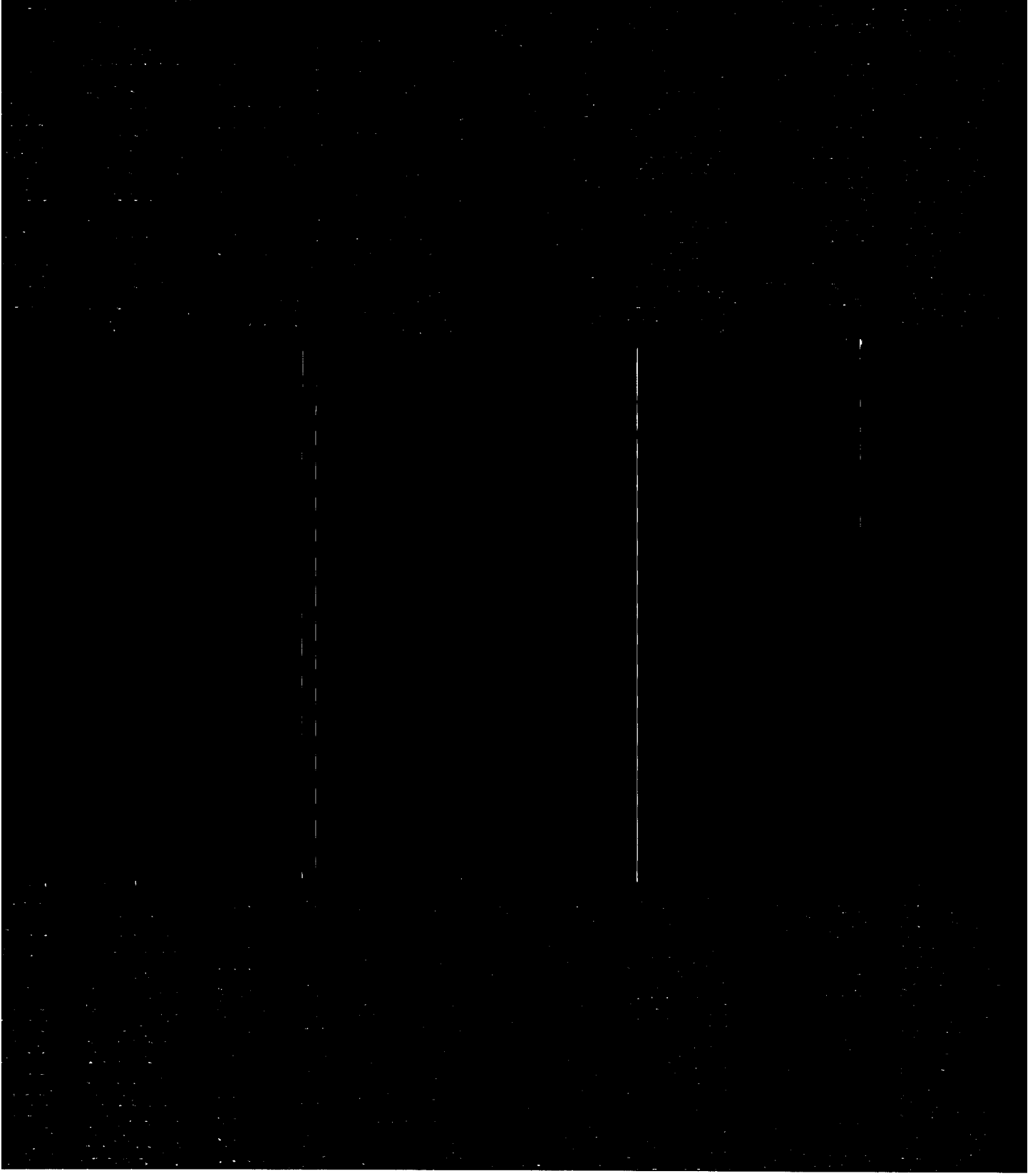
FIG. 1 is a diagrammatic sectional view showing an embodiment of the photosensitive printing plate of this invention.
FIG. 2 is a diagrammatical sectional view showing another embodiment of this invention.

In the embodiment of the photosensitive printing plate of this invention as shown in FIG. 1, over a support 10 having an oleophilic surface is formed a diffusion transfer hydrophilic image-receiving layer 11 containing nucleating materials for physical development and an alginate in accordance with the present invention and over the image-receiving layer is further formed a photosensitive silver halide emulsion layer 12.

Further, in the other embodiment of this invention as shown in FIG. 2, over a support 20 having an oleophilic surface, is formed a diffusion transfer hydrophilic image-receiving layer 21 containing nucleating materials for physical development, and over the image-receiving layer 21 is formed an image-receiving subsidiary layer 22 containing an alginate in accordance with the present invention, and further over the subsidiary layer 22 is formed a photosensitive silver halide emulsion layer 23.

The feature of this invention is that a continuous tone original is accurately reproduced as hard dots in the image-receiving layer by a diffusion transfer development. Of course, the silver imagebearing portions of the image-receiving layer are required to be brought into a state capable of being removed by the etching bleach treatment and hence it is necessary that the medium composing the image-receiving layer can be etched by the action of the silver image according to an etching bleach treatment. As the medium, gelatin that has generally been used in this field suitably used.

In case of incorporating an alginate in the image-receiving layer, the alginate may be incorporated in it as a suitable mixture thereof with the medium for the layer or may be used alone. Also, as the nucleating material for diffusion transfer development, any materials ordinarily used for such a purpose may be used, such as colloidal silver, silver sulfide, nickel sulfide, zinc sulfide, sodium sulfide, colloidal sulfur, thiosinamine, stannous chloride, and chloroauric acid.

In case of applying an image-receiving subsidiary layer containing an alginate, it is usually unnecessary to incorporate the alginate in the image-receiving layer but the alginate may of course be incorporated in the image-receiving layer.

The image-receiving subsidiary layer may be composed of the alginate alone or may be a mixture of the alginate and a medium such as gelatin, gum arabic or other high molecular weight materials.

It is desirable as a photographic emulsion for the photosensitive silver halide emulsion layer to employ the silver halide emulsion in which the exposed silver salt is developed sufficiently quickly in the stage of the diffusion transfer development, while the unexposed silver salt forms, sufficiently fast, a complex compound and is quickly reduced in the image-receiving layer.

The silver halide used in the emulsion may be properly selected from, e.g., silver chloride, silver bromide, silver iodide, silver chlorobromide, silver chloroiodide, and silver chlorobromoiodide. As the binder for the emulsion, gelatin is mainly used but other hydrophilic colloids may be used. The ratio of the silver halide to the binder may be preferably large but a ratio of binder/silver halide of about 0.4–0.6 is particularly profitable for obtaining a hard dot image. To the silver halide emulsion used in this invention may be added various additives usually used, such as sensitizer, a sensitizing dye, an antifoggant, a hardening agent, a surface active agent, etc. In particular, a silver halide photographic emulsion showing hard tone photographic characteristics is preferably used.

As the support, there are a resin film such as a polyethylene terephthalate film or a cellulose acetate film, a sunthetic paper, a waterproof paper, a metallic plate, and a lithograph. In case of using a hydrophilic metallic plate such as aluminum plate, an oleophilic layer is applied to the surface thereof by means of coating, vacuum deposition, plating, spraying, and laminating to provide an inkreceptive surface. A polyethylene terephthalate film is frequently used since it is excellent in oleophilic properties, dimensional stability, and flexibility.

The photosensitive printing material of this invention has an image-receiving layer and a photosensitive emulsion layer on the support, or an image-receiving layer, an image-receiving subsidiary layer, and a photosensitive emulsion layer on the support and if necessary, it may have an antihalation layer, an intermediate layer, a protective layer, etc.

Thus, by incorporating an alginate in the image-receiving layer or the image-receiving subsidiary layer of the photosensitive printing material in accordance with the present invention, the silver image formed in the image-receiving layer by diffusion transfer development becomes hard and accordingly the image is composed of quite hard dots. Also, the silver image has quite an efficient silver structure for the etching bleach.

By employing the photosensitive printing plate of this invention having the above-mentioned structure, a master capable of producing prints or copies having good continuous tone from a color original having continuous tone can be readily produced. That is to say, the printing master is produced by exposing the photosensitive printing plate directly to an original using a contact screen and subjecting the printing plate to a diffusion transfer development and an etching bleach treatment.

Now, the production of a master using the photosensitive printing plate of this invention will be explained below. The photosensitive printing plate is exposed directly to an original of continuous tone using a contact screen by contact printing or enlarge printing. The photosensitive printing plate of this invention is particularly effectively applied to the case of making a master having good continuous tone reproducibility from a color original of continuous tone but it may of course be used for making a master for line work. As the diffusion transfer development, the known technique described in the specification of U.S. Pat. No. 2,352,014 may be utilized. Also, any known etching bleach method may be employed in this invention.

An example of producing a master using the photosensitive printing plate of this invention will be described in detail by referring to the drawing. FIG. 3A is a sectional view showing the state of exposing the photosensitive printing material 36 of this invention to an original 35 of continuous tone through a contact screen 34. The photosensitive printing plate 36 of this invention is composed of an oleophilic polyester sheet 30 having thereon a diffusion transfer image-receiving layer 31 containing nucleating materials for physical development, an image-receiving subsidiary layer 32 containing an alginate, and a photographic silver halide emulsion layer 33 in this order. In region 33a of the emulsion layer is formed a dot latent image from the original of continuous tone by the contact screen. The image formed is a negative image of the original.

FIG. 3B is a sectional view showing the state of subjecting the master to diffusion transfer development. At the exposed areas of the emulsion layer 33, the silver halide is chemically developed and a silver halide is formed. On the other hand, in the image-receiving layer 31 is formed a silver image at the portions corresponding to the unexposed areas. The silver image is formed by the fact that the complex salt of the silver halide is diffused from the unexposed portions of the emulsion layer 33 into the image-receiving layer 31 through the image-receiving subsidiary layer and is brought into contact with the nucleating materials for physical development present there to be reduced into metallic silver. The silver image is a positive image of the original. The master thus developed is washed with water to remove the image-receiving subsidiary layer and the emulsion layer. The washing procedure is not always necessary but is desirable since by the washing procedure the image-receiving layer can be prevented from the undesirable etching action of the silver image at the subsequent etching bleach step. Then, the printing material having the positive silver image is processed by an etching bleach solution containing hydrogen peroxide. By the etching processing the silver image-bearing portions of the image-receiving layer are etched and become readily removable. The addition of a cupric salt, a bromide, or an acid to the etching bleach solution can promote the etching action. Thereafter, by lightly rubbing the surface of the printing plate thus etched with a cotton pad, the etched portions are removed to there expose the the oleophilic surface of the support 30, while the hydrophilic image-receiving layer remains unremoved at the non-exposed portions. This state is shown in FIG. 3C. The master thus prepared can produce high quality prints having excellent continuous tone reproducibility by using a commercially available printing ink and by water moistening.

The present invention will be explained more in detail by the following typical, non-limiting examples.

EXAMPLE 1

A polyethylene terephthalate film having a thickness of 0.18 mm was subjected to a surface treatment by the irradiation of ultraviolet rays and after applying an antihalation layer to one surface of the film, a gelatin-organic solvent dispersion having the following composition was applied to the other surface followed by the drying for 2 minutes at 120°C to provide an intermediate layer of 0.2 microns in thickness;

| | |
|---|---|
| Gelatin | 1 g |
| Water | 1 g |
| Acetic acid | 1 g |
| Methanol | 20 g |
| Acetone | 60 g |
| Methylene chloride | 10 g |
| Tetrachloroethane | 5 g |
| Phenol | 5 g |

Onto the intermediate layer was applied an aqueous solution of sodium alginate containing nucleating material for physical development and having the following composition, and then the coated layer was dried for 60 minutes at 60°C to provide a diffusion transfer hydrophilic image-receiving layer of 0.5 micron in thickness.

| | |
|---|---|
| Nickel sulfide-gelatin dispersion (nickel sulfide 5 × 10$^{-4}$% and gelatin 0.5% by weight. | 0.4 g |
| Sodium alginate | 0.4 g |
| Water | 100 g |
| 1 wt.% aqueous solution of sodium dodecylbenzene sulfonate | 0.4 g |
| 1 wt. % aqueous solution of chromium acetate | 10 g |

On the image-receiving layer was applied an unhardenable lithographic gelatin silver chlorobromide emulsion (containing 70 wt.% silver chloride and 1 mole of silver per kg of emulsion) that had been pachromatically sensitized and had a high contrast in a thickness of 4 microns followed by drying. Furthermore, by applying 1 wt.% aqueous gelatin solution on the silver halide emulsion layer as a protective layer in a thickness of 1 micron, a photosensitive printing plate was obtained.

The photosensitive printing plate thus obtained was exposed behind a halftone screen to a color positive original of continuous tone. The exposure was conducted for 2 seconds using a Fuji Exposure Lamp as a light source and a red filter with a distance of 1 meter from the photosensitive printing plate to the light source at a voltage of 18 volts. Thereafter, the exposed plate was developed for 30 seconds at 25°C by a developing solution having the following composition;

| | |
|---|---|
| p-methylaminophenol sulfate | 5 g |
| Anhydrous sodium sulfite | 65 g |
| Hydroquinone | 15 g |
| Anhydrous sodium thiosulfate | 15 g |
| Sodium hydroxide | 20 g |
| Water added to make 1 liter | |

The printing plate was then washed with water at 30°C to remove the silver halide emulsion layer and immersed for 1 minute at 25°C in an etching bleach solution prepared by combining solution I and solution II having the following compositions in a 1:1 ration;

Solution I

| | |
|---|---|
| Cupric chloride (2H$_2$O) | 10 g |
| Citric acid | 10 g |
| Water added to make 1 liter | |

Solution II 3 wt. % aqueous solution of hydrogen peroxide. By lightly rubbing the surface of the printing plate with a cotton pad, the etched portions of the hydrophilic layer by the silver image were removed and the oleophilic surface of the support were there exposed. Thus, a cyan separate master of the original was obtained.

The cyan separate master was mounted on a Davidson 500-type offset printing machine and 5000 sheets of copies were printed using a commercially available printing ink and moistening water. By the procedure, the cyan separation image of the original was obtained as the high quality prints having excellent continuous tone reproducibility. No scratch was observed on the surface of the master after printing and then it could be used for further printing.

By applying the successive printing of a magenta image, a yellow image, and black image by the same procedure as above, 4-color printed reproductions were obtained.

EXAMPLE 2

By repeating the same procedure as Example 1 except that a coating solution having the following composition for the diffusion transfer hydrophilic image-receiving layer, excellent prints were obtained.

| | |
|---|---|
| Nickel sulfide-gelatin dispersion (same as in Example 1) | 0.6 g |
| Sodium alginate | 0.3 g |
| Gum arabic | 0.3 g |
| Water | 100 g |
| 1 wt.% aqueous solution of sodium dodecylbenzene sulfonate | 0.4 g |
| 1 wt.% aqueous solution of chromium acetate | 12 g |

EXAMPLE 3

By repeating the same procedure as in Example 1 except that a coating solution having the following composition was used as the diffusion transfer hydrophilic image-receiving layer, excellent prints were otained.

| | |
|---|---|
| Nickel sulfide-gelatin dispersion (same as Example 1) | 0.6 g |
| Sodium alginate | 0.3 g |
| Gelatin | 0.3 g |
| Water | 100 g |
| 1 wt.% aqueous solution of sodium dodecylbenzene sulfonate | 0.4 g |
| 1 wt.% aqueous solution of chromium acetate | 12 g |

EXAMPLE 4

By repeating the same procedure as in Example 1 except that an aqueous gelatin solution containing nucleating material for physical development having the following composition was applied as a diffusion transfer hydrophilic image-receiving layer and also an unhardenable aqueous solution of sodium alginate was applied to the image-receiving layer in a thickness of 0.2 micron, excellent prints were obtained.

| | |
|---|---|
| Nickel sulfide-gelatin dispersion (same as Example 1) | 0.6 g |
| Gelatin | 0.6 g |
| Water | 100 g |
| 1 wt.% aqueous solution of sodium dodecylbenzene sulfonate | 0.4 g |
| 1 wt.% aqueous solution of chromium acetate | 12 g |

EXAMPLE 5

By repeating the same procedure as Example 4 except that a coating solution having the following composition was used as the diffusion transfer hydrophilic image-receiving layer, excellent prints were obtained.

| | |
|---|---|
| Nickel sulfide-gelatin dispersion (same as Example 1) | 0.6 g |
| Gelatin | 0.3 g |
| Gum arabic | 0.3 g |
| Water | 100 g |
| 1 wt.% aqueous solution of sodium dodecylbenzene sulfonate | 0.4 g |
| 1 wt.% aqueous solution of chromium acetate | 12 g |

EXAMPLE 6

By repeating the same procedure as in Example 4 except that a coating solution having the following composition was used as the diffusion transfer hydrophilic image-receiving layer, excellent prints were obtained.

| | |
|---|---|
| Nickel sulfide-gelatin dispersion (same as Example 1) | 0.6 g |
| Sodium alginate | 0.3 g |
| Gum arabic | 0.3 g |
| Water | 100 g |
| 1 wt.% aqueous solution of sodium dodecylbenzene sulfonate | 0.4 g |
| 1 wt.% aqueous solution of chromium acetate | 12 g |

What is claimed is:

1. A method of producing a master having excellent continuous tone reproducility using a photosensitive printing plate comprising a support having thereon a diffusion transfer hydrophilic image-receiving layer containing nucleating material for physical development, a photosensitive silver halide emulsion layer, and an alginate-containing image-receiving subsidiary layer between said image-receiving layer and said photosensitive emulsion layer, said process comprising:
    a. exposing the printing plate to a continuous tone original through a contact screen;
    b. chemically developing the resulting latent image in the photosensitive silver halide emulsion layer, whereby a silver image is formed in said image-receiving layer by diffusion of a complex salt of the silver halide from the unexposed portions of the photo-sensitive silver halide emulsion layer through said alginate-containing image-receiving subsidiary layer into the image-receiving layer; and
    c. processing the resulting printing material with an etching bleach solution.

2. The process of claim 1 wherein the image-receiving layer is removed by water-washing after the development and prior to processing with the etching bleach solution.

* * * * *